United States Patent
Kuramoto et al.

(10) Patent No.: US 10,269,531 B2
(45) Date of Patent: Apr. 23, 2019

(54) SCANNING ELECTRON MICROSCOPE

(71) Applicant: JEOL Ltd., Tokyo (JP)

(72) Inventors: Tatsuru Kuramoto, Tokyo (JP); Yuichiro Ohori, Tokyo (JP); Yoshinori Matsuda, Tokyo (JP); Makoto Aoshima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/914,498

(22) Filed: Mar. 7, 2018

(65) Prior Publication Data

US 2018/0261422 A1 Sep. 13, 2018

(30) Foreign Application Priority Data

Mar. 7, 2017 (JP) .................................. 2017-042417

(51) Int. Cl.
*H01J 37/09* (2006.01)
*H01J 37/02* (2006.01)
(Continued)

(52) U.S. Cl.
CPC ............ *H01J 37/09* (2013.01); *H01J 37/023* (2013.01); *H01J 37/14* (2013.01); *H01J 37/244* (2013.01);
(Continued)

(58) Field of Classification Search
CPC .......... H01J 37/28; H01J 37/244; H01J 37/09; H01J 37/023; H01J 2237/2806;
(Continued)

(56) References Cited

U.S. PATENT DOCUMENTS 9,202,667 B2 * 12/2015 Hatano ................ H01J 37/244
2003/0230713 A1 * 12/2003 Golla-Schindler ..... H01J 37/28
250/310
(Continued)

FOREIGN PATENT DOCUMENTS

JP 200184951 A 3/2001

OTHER PUBLICATIONS

Extended European Search Report for European Patent Application No. 18159790 dated Jul. 9, 2018.

*Primary Examiner* — Wyatt A Stoffa
(74) *Attorney, Agent, or Firm* — The Webb Law Firm (57) ABSTRACT

A scanning electron microscope having a charged particle device that processes a specimen using a charged particle beam, the scanning electron microscope includes: an electron source; a secondary-electron detector that detects secondary electrons generated from the specimen; a backscattered-electron detector that is disposed closer to the electron source than a detection surface of the secondary-electron detector to detect backscattered electrons generated from the specimen; a shielding plate for shielding a detection surface of the backscattered-electron detector; and a moving mechanism that moves the shielding plate. In a state where the shielding plate is moved by the moving mechanism so as to shield the detection surface of the backscattered-electron detector, the shielding plate is located between the detection surface of the backscattered-electron detector and the detection surface of the secondary-electron detector.

6 Claims, 11 Drawing Sheets (51) Int. Cl.
*H01J 37/244* (2006.01)
*H01J 37/28* (2006.01)
*H01J 37/305* (2006.01)
*H01J 37/14* (2006.01)
*H01J 37/30* (2006.01)

(52) U.S. Cl.
CPC .......... *H01J 37/28* (2013.01); *H01J 37/3005* (2013.01); *H01J 37/3056* (2013.01); *H01J 2237/024* (2013.01); *H01J 2237/0262* (2013.01); *H01J 2237/14* (2013.01); *H01J 2237/2448* (2013.01); *H01J 2237/24475* (2013.01); *H01J 2237/2804* (2013.01); *H01J 2237/2806* (2013.01)

(58) Field of Classification Search
CPC ....... H01J 2237/2804; H01J 2237/2448; H01J 2237/24475; H01J 2237/026; H01J 2237/024
See application file for complete search history.

(56) References Cited

U.S. PATENT DOCUMENTS

| | | | |
|---|---|---|---|
| 2005/0133719 A1* | 6/2005 | Todokoro | G01N 23/225 250/310 |
| 2005/0279937 A1* | 12/2005 | Koike | B82Y 10/00 250/310 |
| 2008/0035843 A1 | 2/2008 | Hatano et al. | |
| 2009/0200463 A1* | 8/2009 | Degenhardt | H01J 37/244 250/307 |
| 2011/0006209 A1* | 1/2011 | Yoshikawa | H01J 37/023 250/310 |
| 2013/0001420 A1 | 1/2013 | Nomaguchi et al. | |
| 2014/0361165 A1* | 12/2014 | Sed'a | H01J 37/12 250/307 |
| 2015/0371820 A1* | 12/2015 | Chen | H01J 37/261 250/307 |
| 2016/0148782 A1* | 5/2016 | Agemura | H01J 37/244 250/310 |
| 2018/0033589 A1* | 2/2018 | Schamber | H01J 37/244 |

* cited by examiner

SCANNING ELECTRON MICROSCOPE

CROSS REFERENCE TO RELATED APPLICATION

This application claims priority to Japanese Patent Application No. 2017-042417, filed on Mar. 7, 2017, the disclosure of which is hereby incorporated by reference in its entirety.

BACKGROUND OF THE INVENTION

The present invention relates to a scanning electron microscope.

In recent years, attention has been focused on a scanning electron microscope (SEM) including a focused ion-beam (FIB) device. Such a scanning electron microscope includes a SEM column and a FIB column.

As disclosed in Japanese Patent Application Publication No. 2001-84951, a scanning electron microscope including a FIB device includes a secondary-electron detector which is used during both of FIB processing and SEM observation and a backscattered-electron detector which is used only during SEM observation.

The backscattered-electron detector has a high detection sensitivity to a backscattered electron having a relatively high energy. However, during FIB processing, an electron having a high energy such as a backscattered electron is not formed, and therefore observation cannot be performed using the backscattered-electron detector. Accordingly, the backscattered-electron detector is used only during SEM observation.

The secondary-electron detector can be used not only during SEM observation, but also during FIB processing. For example, secondary electrons generated from a specimen during FIB processing are detected using the secondary-electron detector, and an amount of signal resulting from the secondary electrons is illustrated as a graph or an image. The amount of signal (such as, e.g., a change in the brightness of the image) resulting from the secondary electrons allows the state of the specimen to be monitored and allows the end of the processing to be determined.

In the scanning electron microscope including the FIB device, sputtered particles generated by FIB processing are deposited in a chamber to form a deposited film. When the deposited film is formed over the detection surface of the backscattered-electron detector and it grows, the detection sensitivity of the backscattered-electron detector deteriorates.

In such an electromagnetic field as to allow an electron beam to be bent, backscattered electrons are scarcely deflected, and sputtered particles follow linear trajectories. As a result, no matter where the backscattered-electron detector is placed in a specimen chamber, as long as backscattered electrons are detected, sputtered particles are also deposited.

SUMMARY

The invention can provide a scanning electron microscope which allows a secondary-electron detector to detect secondary electrons, while preventing contamination of a backscattered-electron detector.

According to one aspect of the invention, there is provided a scanning electron microscope having a charged particle device that processes a specimen using a charged particle beam, the scanning electron microscope comprising: an electron source;

a secondary-electron detector that detects secondary electrons generated from the specimen;

a backscattered-electron detector that is disposed closer to the electron source than a detection surface of the secondary-electron detector to detect backscattered electrons generated from the specimen;

a shielding plate for shielding a detection surface of the backscattered-electron detector; and a moving mechanism that moves the shielding plate, wherein in a state where the shielding plate is moved by the moving mechanism so as to shield the detection surface of the backscattered-electron detector, the shielding plate is located between the detection surface of the backscattered-electron detector and the detection surface of the secondary-electron detector.

DETAILED DESCRIPTION OF THE EMBODIMENT (1) According to one embodiment of the invention, there is provided a scanning electron microscope having a charged particle device that processes a specimen using a charged particle beam, the scanning electron microscope comprising:

an electron source;

a secondary-electron detector that detects secondary electrons generated from the specimen;

a backscattered-electron detector that is disposed closer to the electron source than a detection surface of the secondary-electron detector to detect backscattered electrons generated from the specimen;

a shielding plate for shielding a detection surface of the backscattered-electron detector; and a moving mechanism that moves the shielding plate, wherein in a state where the shielding plate is moved by the moving mechanism so as to shield the detection surface of the backscattered-electron detector, the shielding plate is located between the detection surface of the backscattered-electron detector and the detection surface of the secondary-electron detector.

In such a scanning electron microscope, in the state where the shielding plate is moved by the moving mechanism so as to shield the detection surface of the backscattered-electron detector, the shielding plate is located between the detection surface of the backscattered-electron detector and the detection surface of the secondary-electron detector. This allows the secondary-electron detector to detect the secondary electrons during the processing, while preventing contamination of the backscattered-electron detector. Accordingly, in such a scanning electron microscope, it is possible to suppress the deterioration of the detection sensitivity of the backscattered-electron detector due to the contamination thereof. It is also possible to monitor the state of the specimen during the processing.

(2) The foregoing scanning electron microscope may further comprise an objective lens, and the objective lens may have a configuration in which the specimen is placed in a lens magnetic field generated by the objective lens.

(3) In the foregoing scanning electron microscope, the objective lens may have a first opening provided to extend in a direction orthogonal to an optical axis of the objective lens and allow the secondary-electron detector to pass therethrough and a second opening provided to extend in a direction orthogonal to the optical axis and allow the shielding plate to pass therethrough, and each of the first opening and the second opening may have a shape having a longitudinal direction along the optical axis when viewed from the direction orthogonal to the optical axis.

In such a scanning electron microscope, it is possible to dispose the shielding plate and the secondary-electron detector without causing contact therebetween.

(4) In the foregoing scanning electron microscope, a predetermined voltage may be applied to the shielding plate to cause a repulsive force between the shielding plate and the secondary electrons.

Such a scanning electron microscope allows an improvement in the efficiency of secondary electron detection.

(5) In the foregoing scanning electron microscope, the charged particle device may be a focused ion-beam device.

(6) In the foregoing scanning electron microscope, the secondary-electron detector may detect secondary electrons generated by irradiation of the charged particle beam emitted from the charged particle device to the specimen.

The following will describe in detail preferred embodiments of the invention with reference to the drawings. Note that the embodiments described below do not unduly limit the content of the invention as stated in the claims. Note also that all of the elements described in connection with the following embodiments should not necessarily be taken as essential elements of the invention.

1. Scanning Electron Microscope

Figure 1:
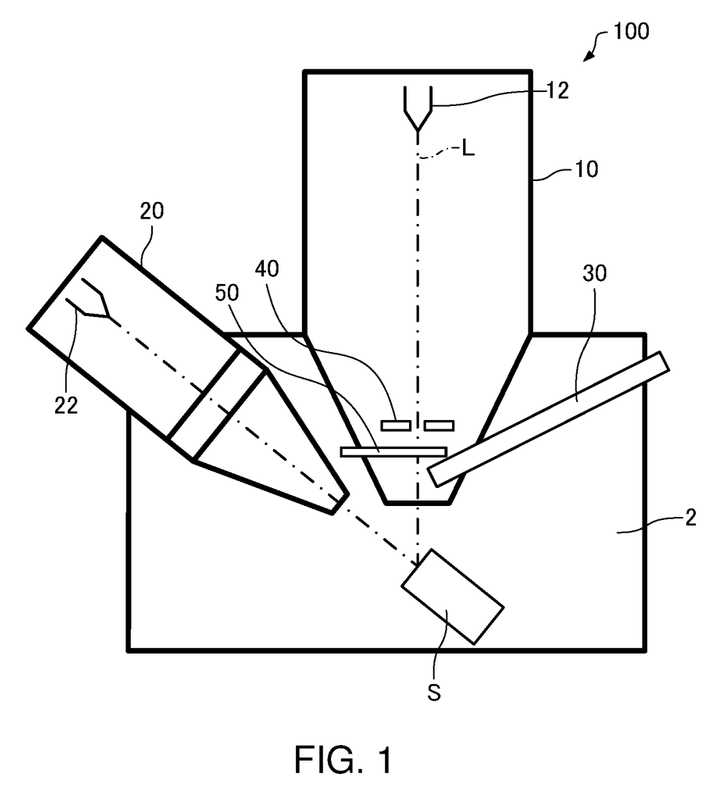
FIG. 1 is a schematic view illustrating a scanning electron microscope according to one embodiment of the invention.

Referring to the drawings, a description will be given first of a scanning electron microscope according to one embodiment of the invention. FIG. 1 is a schematic view illustrating a scanning electron microscope 100 according to one embodiment of the invention.

As illustrated in FIG. 1, the scanning electron microscope 100 includes a focused ion-beam device (an example of a charged particle device) which processes a specimen S using an ion beam (an example of a charged particle beam). The scanning electron microscope 100 allows the processing of the specimen S using a FIB and the observation of the specimen S using the SEM to be performed.

The scanning electron microscope 100 includes a SEM column 10, a FIB column 20, a secondary-electron detector 30, a backscattered-electron detector 40, and a shielding plate 50.

The SEM column 10 is an optical system for effecting the formation of an electron probe and the scanning of the electron probe. The SEM column 10 includes an electron source (electron gun) 12 which emits an electron beam, a lens system which focuses the electron beam to form the electron probe, and a scanning coil for scanning the electron probe. In the SEM column 10, the electron beam emitted from the electron source 12 travels downward along an optical axis L of the SEM column 10 to be applied to the specimen S.

In the scanning electron microscope 100, the SEM column 10 scans the specimen S with the electron probe (electron beam) and the secondary-electron detector 30 detects secondary electrons generated from the specimen S to allow a secondary electron image to be obtained. Also, in the scanning electron microscope 100, the SEM column 10 scans the specimen S with the electron probe (electron beam) and the backscattered-electron detector 40 detects backscattered electrons generated from the specimen S to allow a backscattered electron image to be obtained.

The FIB column 20 is an optical system for effecting the formation of an ion beam and the scanning of the ion beam. The FIB column 20 includes an ion source (ion gun) 22 which emits the ion beam, a lens system for focusing the ion beam, and a deflector for effecting the scanning of the ion beam.

In the scanning electron microscope 100, the FIB column 20 scans the specimen S with the ion beam (focused ion beam) to allow the specimen S to be processed.

The secondary-electron detector 30 detects secondary electrons generated from the specimen S. The secondary-electron detector 30 is used during both of FIB processing and SEM observation. That is, the secondary-electron detector 30 can detect the secondary electrons generated by the irradiation of the focused ion beam to the specimen S and can also detect the secondary electrons generated by the irradiation of the electron beam (electron probe) to the specimen S.

The backscattered-electron detector 40 detects backscattered electrons generated from the specimen S. The backscattered-electron detector 40 has a high detection sensitivity to the backscattered electrons each having a relatively high energy. Accordingly, during FIB processing during which an electron having a high energy such as a backscattered electron is not generated, the backscattered-electron detector 40 cannot be used. For this reason, the backscattered-electron detector 40 is used only during the SEM observation.

The shielding plate 50 shields the detection surface of the backscattered-electron detector 40 during FIB processing. The shielding plate 50 is movable by a moving mechanism (a moving mechanism 60 illustrated in FIG. 2 described later). This allows the shielding plate 50 to be disposed at a position where the shielding plate 50 shields the detection surface of the backscattered-electron detector 40 during FIB processing and disposed at a position where the shielding plate 50 does not shield the detection surface of the backscattered-electron detector 40 during SEM observation.

In the scanning electron microscope 100, the specimen S is placed in a specimen chamber 2. In the specimen chamber 2, the specimen S is placed on a specimen stage (not shown). To the specimen chamber 2, the SEM column 10, the FIB column 20, and the secondary-electron detector 30 are attached.

Figure 2:
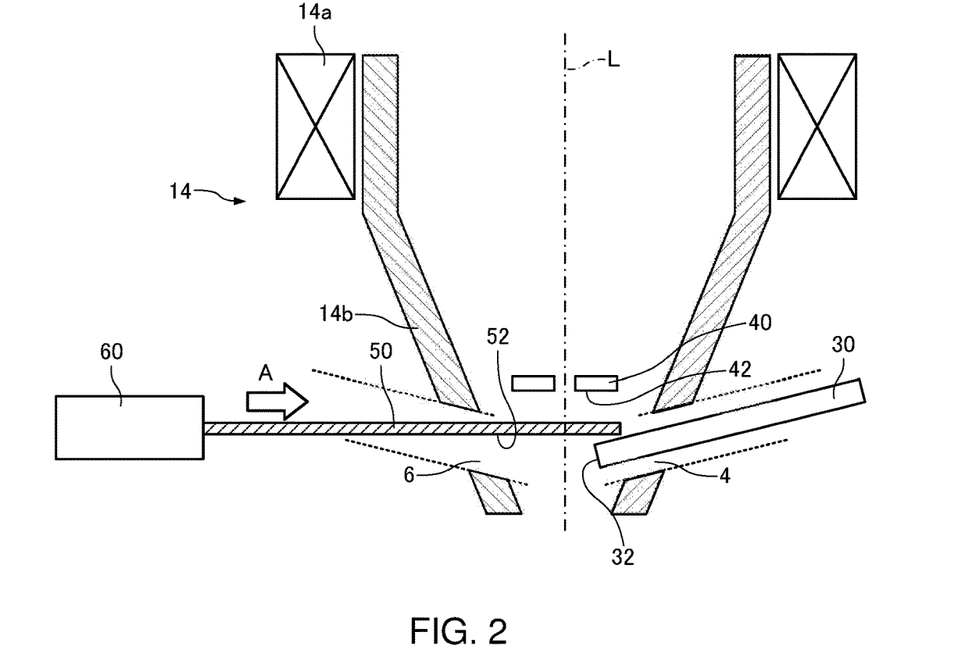
FIG. 2 is a schematic view illustrating a configuration of the vicinity of the objective lens of a SEM column in the scanning electron microscope according to one embodiment of the invention.
Figure 3:
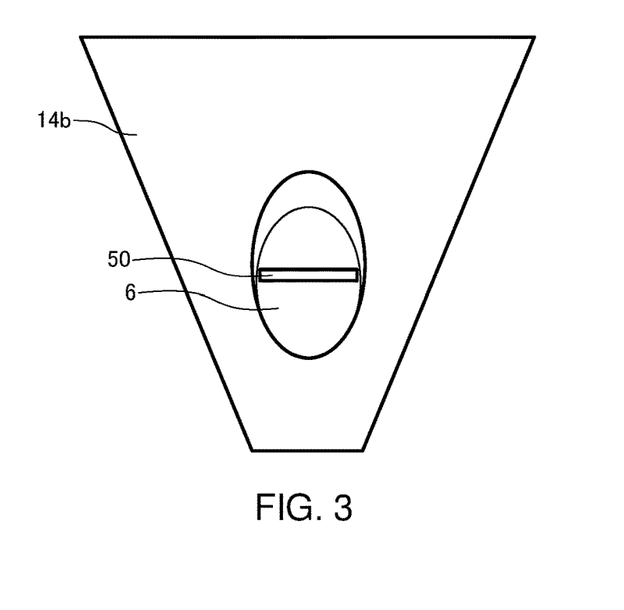
FIG. 3 is a schematic view of the objective lens in the scanning electron microscope according to one embodiment of the invention, when viewed from the side.
Figure 4:
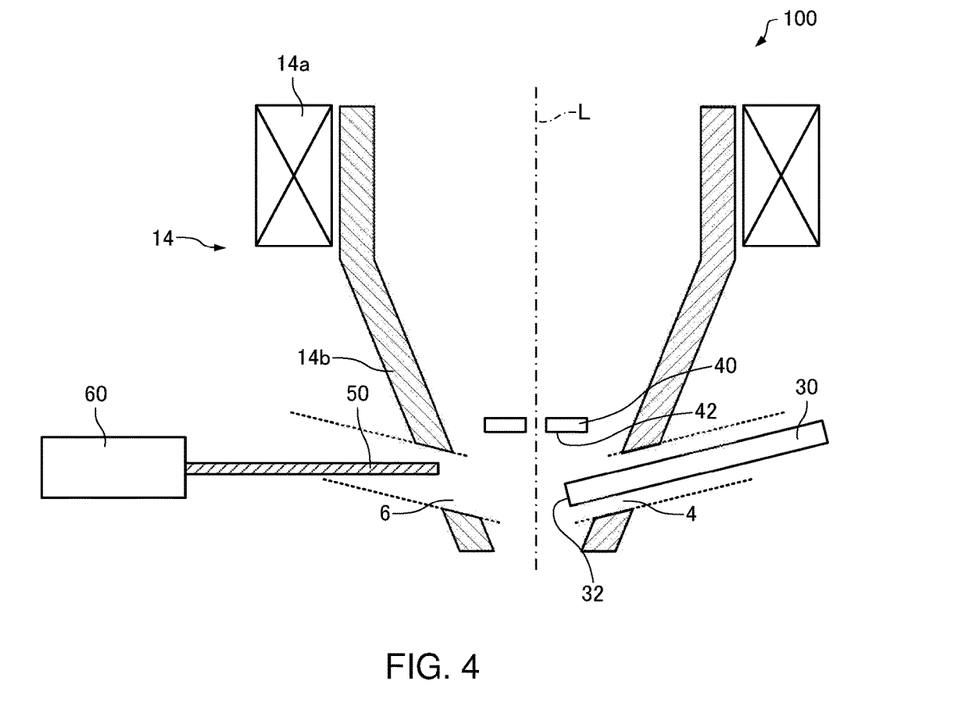
FIG. 4 is a schematic view illustrating a configuration of the vicinity of the objective lens of the SEM column in the scanning electron microscope according to one embodiment of the invention.

FIGS. 2 and 4 are schematic views each illustrating a configuration of the vicinity of an objective lens 14 in the SEM column 10. FIG. 3 is a schematic view of the objective lens 14 viewed from the side (direction of the arrow A illustrated in FIG. 2, which is orthogonal to the optical axis L).

Note that FIG. 2 shows the state where the shielding plate 50 shields a detection surface 42 of the backscattered-electron detector 40, while FIG. 4 shows the state where the shielding plate 50 does not shield the detection surface 42 of the backscattered-electron detector 40. In FIGS. 2 and 4, for the sake of convenience, the illustration of the members other than the objective lens 14, the secondary-electron detector 30, the backscattered-electron detector 40, the shielding plate 50, and the moving mechanism 60 is omitted.

The objective lens 14 has a coil 14a and a magnetic pole 14b. In the objective lens 14, a current is allowed to flow in the coil 14a and thus generate magnetism, and a lens magnetic field is allowed to leak from the magnetic pole 14b into a space. The objective lens 14 has a configuration in which the specimen S is placed in the lens magnetic field (leakage magnetic field) generated so as to focus an electron beam. That is, the objective lens 14 is a magnetic immersion lens. In the example illustrated in the drawings, the objective lens 14 is a single pole piece lens having one pole piece.

When the objective lens 14 is the magnetic immersion lens, the lens magnetic field generated by the objective lens 14 functions to introduce secondary electrons into the objective lens 14. Consequently, the secondary electrons and the backscattered electrons are upwardly led by the lens magnetic field generated by the objective lens 14 along the optical axis L.

In the magnetic pole 14b of the objective lens 14, an opening 4 (first opening) and an opening 6 (second opening) are provided. To ensure symmetry for the structure of the objective lens 14, the opening 4 and the opening 6 are provided symmetrically relative to the optical axis L. As illustrated in FIGS. 2 and 3, the opening 4 and the opening 6 are formed to be inclined at predetermined angles with respect to a horizontal direction (direction orthogonal to the optical axis L). In the example illustrated in the drawings, the openings 4 and 6 are inclined downwardly and inwardly from the outside of the objective lens 14.

The secondary-electron detector 30 is placed such that a detection surface 32 faces the optical axis L through the opening 4 provided in the magnetic pole 14b of the objective lens 14. The secondary-electron detector 30 is disposed along the center axis of the opening 4. Accordingly, the secondary-electron detector 30 is disposed to be inclined with respective to the horizontal direction such that the detection surface 32 of the secondary-electron detector 30 faces downward.

The backscattered-electron detector 40 (detection surface 42) is disposed closer to the electron source 12 than the detection surface 32 of the secondary-electron detector 30. In the example illustrated in the drawings, the backscattered-electron detector 40 is disposed above the detection surface 32 of the secondary-electron detector 30. The backscattered-electron detector 40 is disposed in the objective lens 14.

As illustrated in FIGS. 2 and 4, the shielding plate 50 is movable by the moving mechanism 60. Specifically, the moving mechanism 60 can move the shielding plate 50 between the position (inserted state) where the shielding plate 50 shields the detection surface 42 of the backscattered-electron detector 40 illustrated in FIG. 2 and the position (extracted state) where the shielding plate 50 does not shield the detection surface 42 of the backscattered-electron detector 40 illustrated in FIG. 4. That is, in the scanning electron microscope 100, the shielding plate 50 is insertable/extractible.

At the position where the shielding plate 50 shields the detection surface 42 of the backscattered-electron detector 40 illustrated in FIG. 2, the shielding plate 50 is located closer to the electron source 12 than the detection surface 32 of the secondary-electron detector 30, i.e., above the detection surface 32 of the secondary-electron detector 30. The shielding plate 50 is located between the detection surface 42 of the backscattered-electron detector 40 and the detection surface 32 of the secondary-electron detector 30. This can allow the secondary-electron detector 30 to detect secondary electrons during FIB processing, while preventing sputtered particles from contaminating the backscattered electron detector 40.

The shielding plate 50 is placed so as to be located in the objective lens 14 (in the magnetic pole 14b) through the opening 6 provided in the magnetic pole 14b of the objective lens 14. A main surface 52 of the shielding plate 50 is disposed to extend in the horizontal direction. Consequently, in the inserted state illustrated in FIG. 2, the shielding plate 50 is located above the detection surface 32 (closer to the electron source 12) of the secondary-electron detector 30 obliquely inserted from the opening 4 such that the detection surface 32 faces downward. This allows the shielding plate 50 to be located between the detection surface 42 of the backscattered-electron detector 40 and the detection surface 32 of the secondary-electron detector 30.

When the shielding plate 50 in the inserted state is viewed from the specimen S in an upward direction (when the shielding plate 50 is viewed in a direction toward the electron source 12), it is preferable that the shielding plate 50 shields the entire detection surface 42 of the backscattered-electron detector 40. However, it may also be possible that the shielding plate 50 shields a portion of the detection surface 42 of the backscattered-electron detector 40.

As illustrated in FIG. 4, in the extracted state, the shielding plate 50 is disposed at the position where the shielding plate 50 does not shield the detection surface 42 of the backscattered-electron detector 40. In other words, the shielding plate 50 is disposed at the position where the shielding plate 50 does not interrupt the detection of backscattered electrons by the backscattered-electron detector 40. In the example illustrated in FIG. 4, the shielding plate 50 is located outside the magnetic pole 14b.

Preferably, the shielding plate 50 has conductivity to be prevented from being charged. Examples of the material of the shielding plate 50 include metal and carbon.

The moving mechanism 60 includes a drive unit such as, e.g., a motor and moves the shielding plate 50 by operating the drive unit. Note that the moving mechanism 60 may also have no drive unit and allow a user to manually move the shielding plate 50.

Next, a description will be given of the operation of the scanning electron microscope 100.

In the scanning electron microscope 100, during FIB processing, i.e., when a focused ion beam is applied from the FIB column 20 to the specimen S to process the specimen S, the moving mechanism 60 is operated to bring the shielding plate 50 into the inserted state. Consequently, as illustrated in FIG. 2, the shielding plate 50 is located between the detection surface 32 of the secondary-electron detector 30 and the detection surface 42 of the backscattered-electron detector 40.

As a result, the shielding plate 50 blocks sputtered particles generated by the irradiation of the focused ion beam to the specimen S. This can reduce the probability that the sputtered particles adhere to the detection surface 42 of the backscattered-electron detector 40. In addition, since the shielding plate 50 does not shield the detection surface 32 of the secondary-electron detector 30, the secondary-electron detector 30 can detect secondary electrons generated by the irradiation of the focused ion beam to the specimen S. This allows the state of the specimen S to be monitored during FIB processing. Moreover, a problem associated with positional reproducibility which is assumed when the backscattered-electron detector 40 is moved does not arise.

In the scanning electron microscope 100, during SEM observation, i.e., when an electron beam (electron probe) is applied to the specimen S from the SEM column 10 and SEM observation is performed, the moving mechanism 60 is operated to bring the shielding plate 50 into the extracted state. Consequently, as illustrated in FIG. 4, the shielding plate 50 is located at the position where the shielding plate 50 does not shield the detection surface 42 of the backscattered-electron detector 40.

This allows the secondary-electron detector 30 to detect the secondary electrons generated by the irradiation of the electron beam to the specimen S and also allows the backscattered-electron detector 40 to detect the backscattered electrons generated by the irradiation of the electron beam to the specimen S.

The scanning electron microscope 100 has, e.g., the following characteristic features.

In the scanning electron microscope 100, the detection surface 42 of the backscattered-electron detector 40 is located closer to the electron source 12 than the detection surface 32 of the secondary-electron detector 30. In the state where the shielding plate 50 is moved by the moving mechanism 60 so as to shield the detection surface 42 of the backscattered-electron detector 40, the shielding plate 50 is located between the detection surface 42 of the backscattered-electron detector 40 and the detection surface 32 of the secondary-electron detector 30. Accordingly, in the scanning electron microscope 100, during FIB processing, it is possible to allow the secondary-electron detector 30 to detect secondary electrons, while preventing the contamination of the backscattered-electron detector 40. Consequently, in the scanning electron microscope 100, it is possible to suppress the deterioration of the detection sensitivity of the backscattered-electron detector 40 due to the contamination thereof. In addition, in the scanning electron microscope 100, it is possible to monitor the state of the specimen S during FIB processing.

Figure 5:
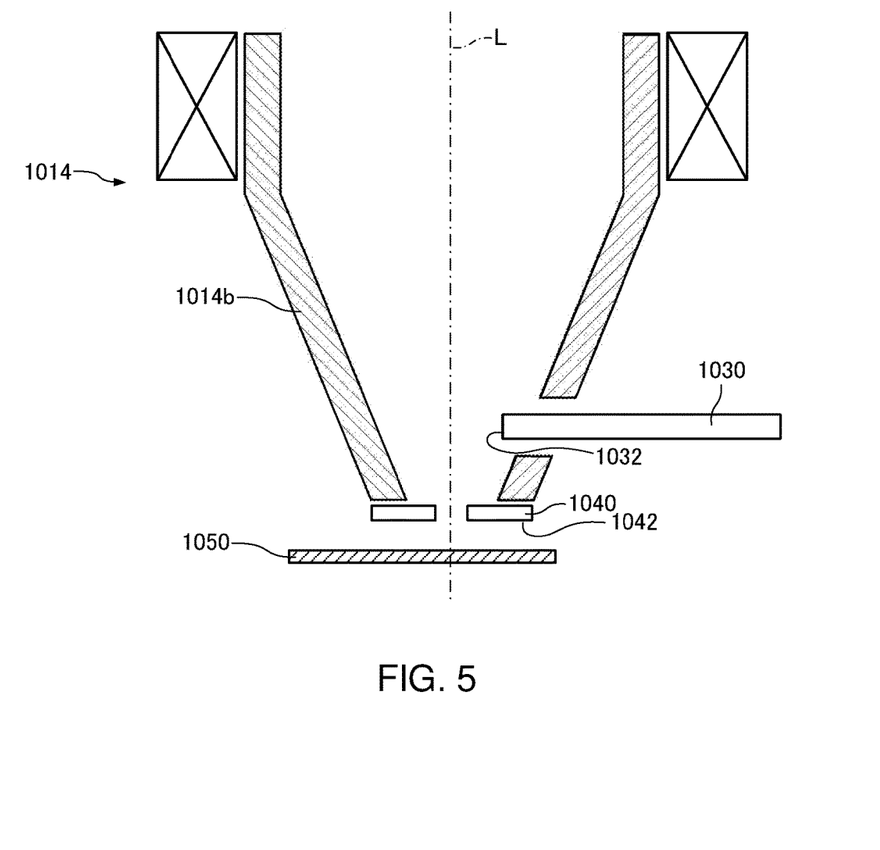
FIG. 5 is a schematic view illustrating a configuration of the vicinity of the objective lens in a scanning electron microscope according to a reference example.

FIG. 5 is a schematic view illustrating a configuration of the vicinity of an objective lens 1014 in a scanning electron microscope according to a reference example.

The objective lens 1014 is a magnetic immersion lens, and the lens magnetic field thereof functions to introduce secondary electrons into the objective lens 1014. Accordingly, a secondary-electron detector 1030 is disposed in the opening provided in a magnetic pole 1014b of the objective lens 1014. On the other hand, a backscattered-electron detector 1040 is disposed in the vicinity of the tip portion of the objective lens 1014. In such a configuration, when a shielding plate 1050 shields a detection surface 1042 of the backscattered-electron detector 1040 as illustrated in FIG. 5, the shielding plate 1050 also shields a detection surface 1032 of the secondary-electron detector 1030. As a result, a problem arises in that, during FIB processing, the secondary-electron detector 1030 cannot detect secondary electrons and therefore cannot monitor the state of the specimen S.

By contrast, in the scanning electron microscope 100, as described above, the detection surface 42 of the backscattered-electron detector 40 is disposed closer to the electron source 12 than the detection surface 32 of the secondary-electron detector 30 and, during processing, the shielding plate 50 can be located between the detection surface 42 of the backscattered-electron detector 40 and the detection surface 32 of the secondary-electron detector 30. Consequently, such a problem as has arisen in the reference example illustrated in FIG. 5 does not arise and, during FIB processing, it is possible to allow the secondary-electron detector 30 to detect secondary electrons, while preventing the contamination of the backscattered-electron detector 40.

2. Modifications of Scanning Electron Microscope

Next, referring to the drawings, a description will be given of scanning electron microscopes according to modifications of the foregoing embodiment. In scanning electron microscopes 200, 300, 400, 500, and 600 according to the modifications of the foregoing embodiments, components having the same functions as the components of the scanning electron microscope 100 according to the foregoing embodiments are denoted by the same reference numerals and a detailed description thereof is omitted.

2.1. First Modification

Figure 6:
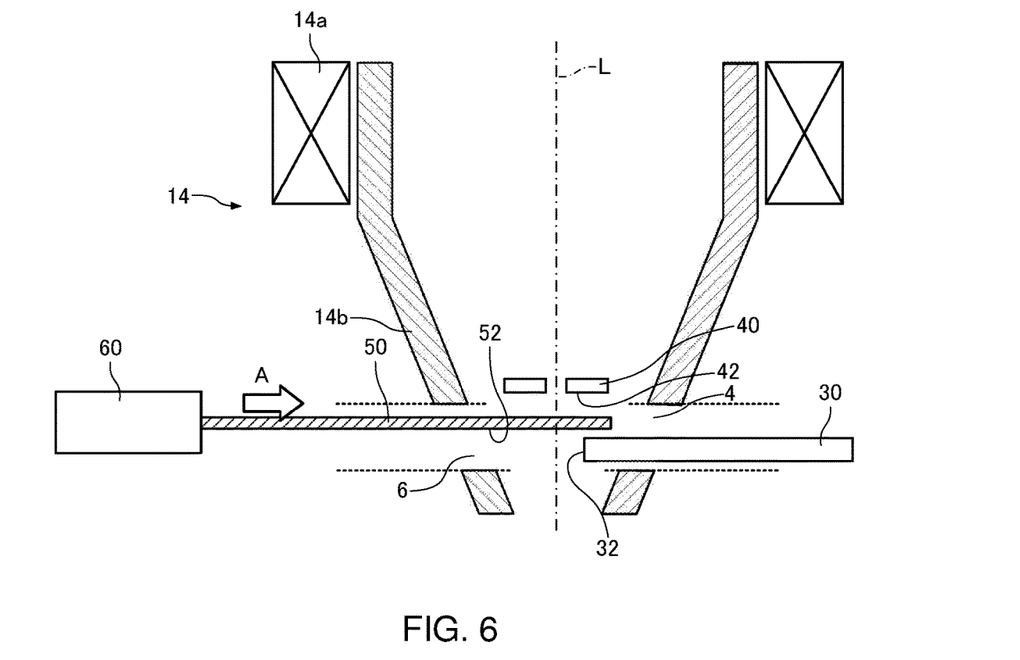
FIG. 6 is a schematic view illustrating a configuration of the vicinity of an objective lens in a scanning electron microscope according to a first modification.
Figure 7:
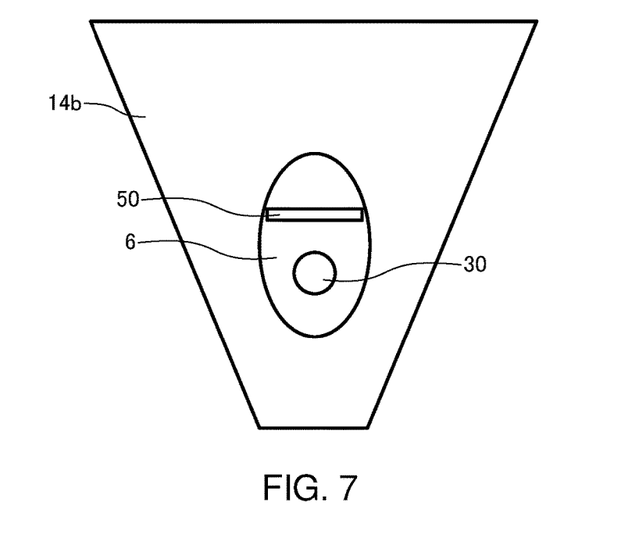
FIG. 7 is a schematic view of the objective lens in the scanning electron microscope according to the first modification, when viewed from the side.

FIG. 6 is a schematic view illustrating a configuration of the vicinity of the objective lens 14 in a scanning electron microscope 200 according to the first modification. FIG. 7 is a schematic view of the objective lens 14 viewed from the side (or from the direction of the arrow A in FIG. 6). Note that FIG. 6 corresponds to FIG. 2, while FIG. 7 corresponds to FIG. 3.

In the scanning electron microscope 100 described above, as illustrated in FIGS. 2 and 3, the shielding plate 50 is disposed to extend in the horizontal direction, and the secondary-electron detector 30 is obliquely disposed such that the detection surface 32 of the secondary-electron detector 30 faces downward. Thus, in the inserted state, the shielding plate 50 is disposed above the detection surface 32 of the secondary-electron detector 30 to be located between the detection surface 42 of the backscattered-electron detector 40 and the detection surface 32 of the secondary-electron detector 30.

By contrast, in the scanning electron microscope 200, as illustrated in FIGS. 6 and 7, each of the shielding plate 50 and the secondary-electron detector 30 is disposed to extend in the horizontal direction, and the shielding plate 50 is disposed at an upper position (closer to the electron source 12), while the secondary-electron detector 30 is disposed at a lower position (closer to the specimen). Thus, the shielding plate 50 is disposed above the detection surface 32 of the secondary-electron detector 30 to be located between the detection surface 42 of the backscattered-electron detector 40 and the detection surface 32 of the secondary-electron detector 30.

Each of the opening 4 for allowing the secondary-electron detector 30 to pass therethrough and the opening 6 for allowing the shielding plate 50 to pass therethrough is a through hole provided to extend in a direction orthogonal to the optical axis L. Each of the opening 4 and the opening 6 has a shape having a longitudinal direction along the optical axis L (parallel with the optical axis L) when viewed from the direction of the arrow A, as illustrated in FIG. 3. For example, each of the opening 4 and the opening 6 has an elliptic shape having a long axis along the optical axis L. Since each of the opening 4 and the opening 6 thus has the shape having the longitudinal direction along the optical axis L, it is possible to dispose the shielding plate 50 and the secondary-electron detector 30 without causing contact therebetween.

The scanning electron microscope 200 according to the first modification can achieve the same effects achieved by the embodiments described above.

2.2. Second Modification

Figure 8:
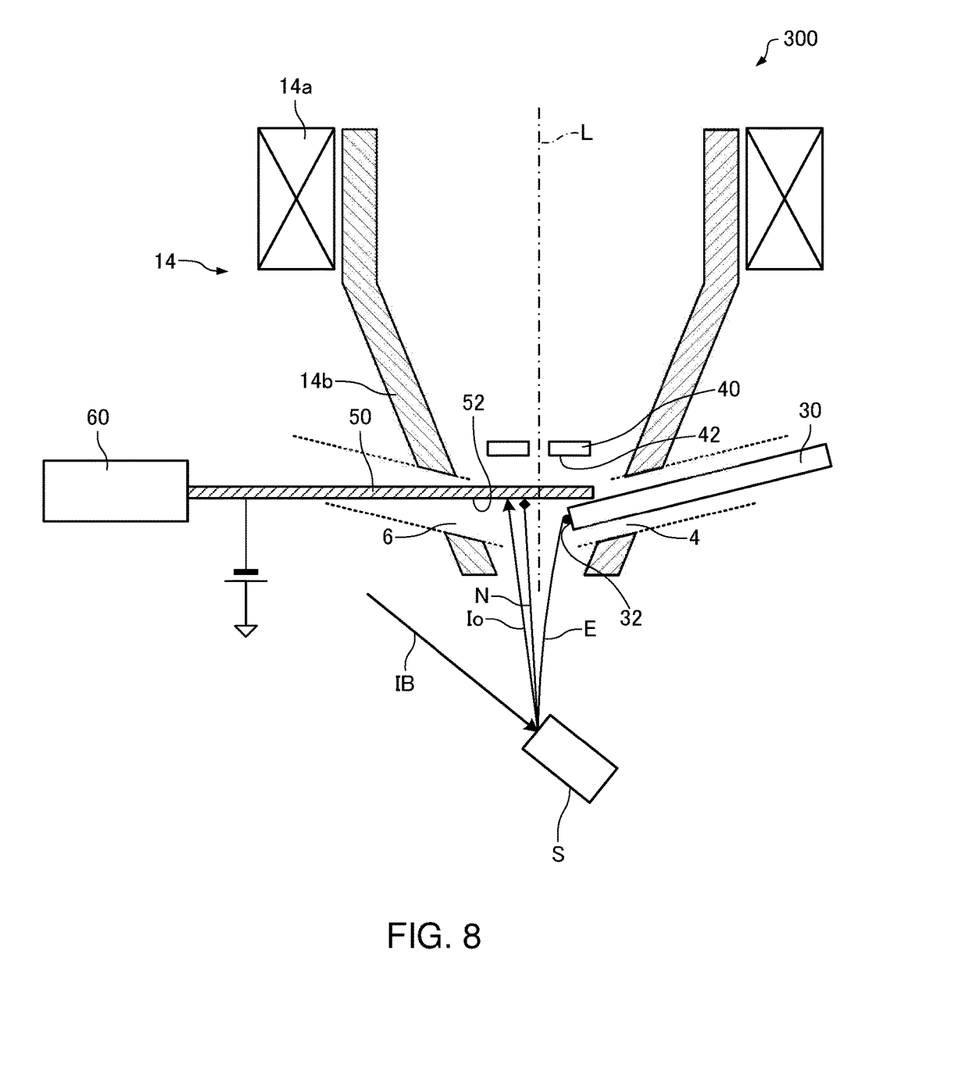
FIG. 8 is a schematic view illustrating a configuration of the vicinity of an objective lens in a scanning electron microscope according to a second modification.

FIG. 8 is a schematic view illustrating a configuration of the vicinity of the objective lens 14 in a scanning electron microscope 300 according to the second modification. Note that FIG. 8 corresponds to FIG. 2.

In the scanning electron microscope 300 according to the second modification, as illustrated in FIG. 8, a predetermined voltage (negative voltage relative to a reference voltage for the device) is applied to the shielding plate 50. As a result, a repulsive force against secondary electrons E, i.e., a force (repulsive force) which brings the secondary electrons E away from the shielding plate 50 acts on the secondary electrons E. This can increase secondary electrons incident on the detection surface 32 of the secondary-electron detector 30 and improve detection efficiency (the ratio of the electrons emitted from the specimen S and detected to result in signal to all the electrons emitted from the specimen S).

Note that ions Io each having a positive charge, sputtered particles N each having no charge, and the like are scarcely affected by the electric field formed by the shielding plate 50.

Figure 9:
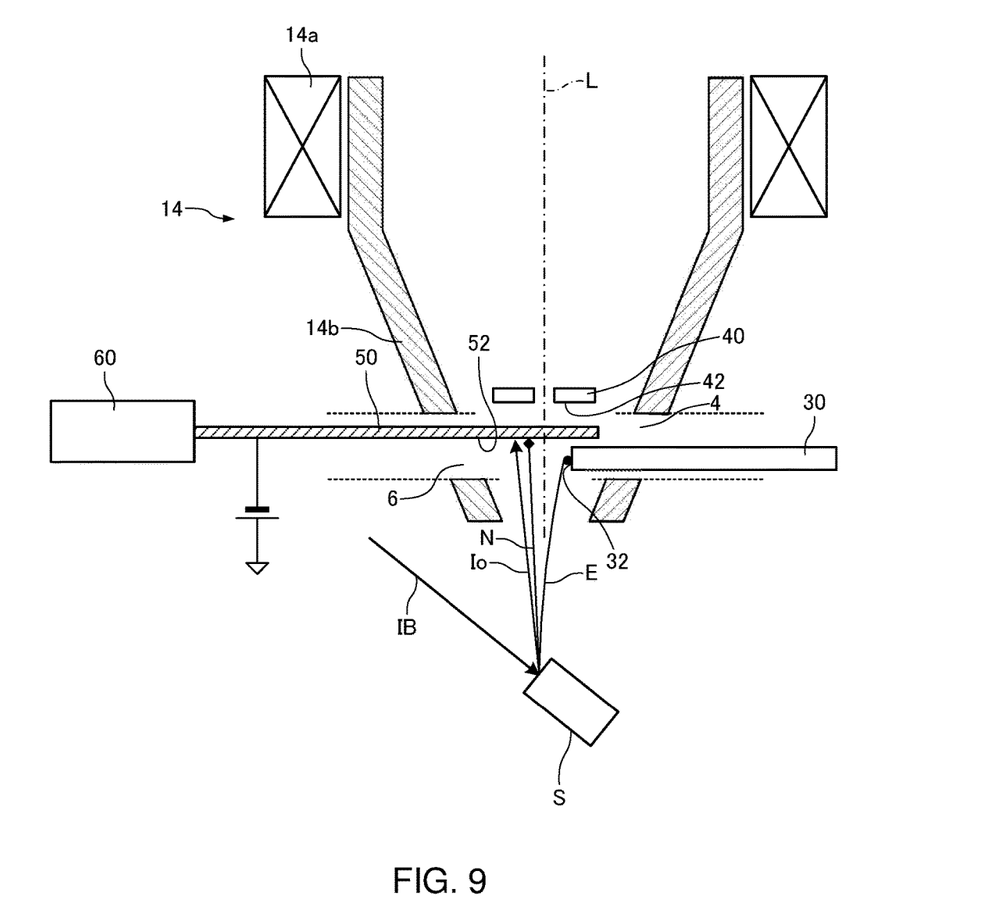
FIG. 9 is a schematic view illustrating the configuration of the vicinity of the objective lens in the scanning electron microscope according to the second modification.

The foregoing description has been given of the example in which the second modification is applied to the configuration of the scanning electron microscope 100 illustrated in FIG. 2. However, as illustrated in FIG. 9, the second modification is similarly applicable to the configuration of the scanning electron microscope 200 according to the first modification.

2.3. Third Modification

Figure 10:
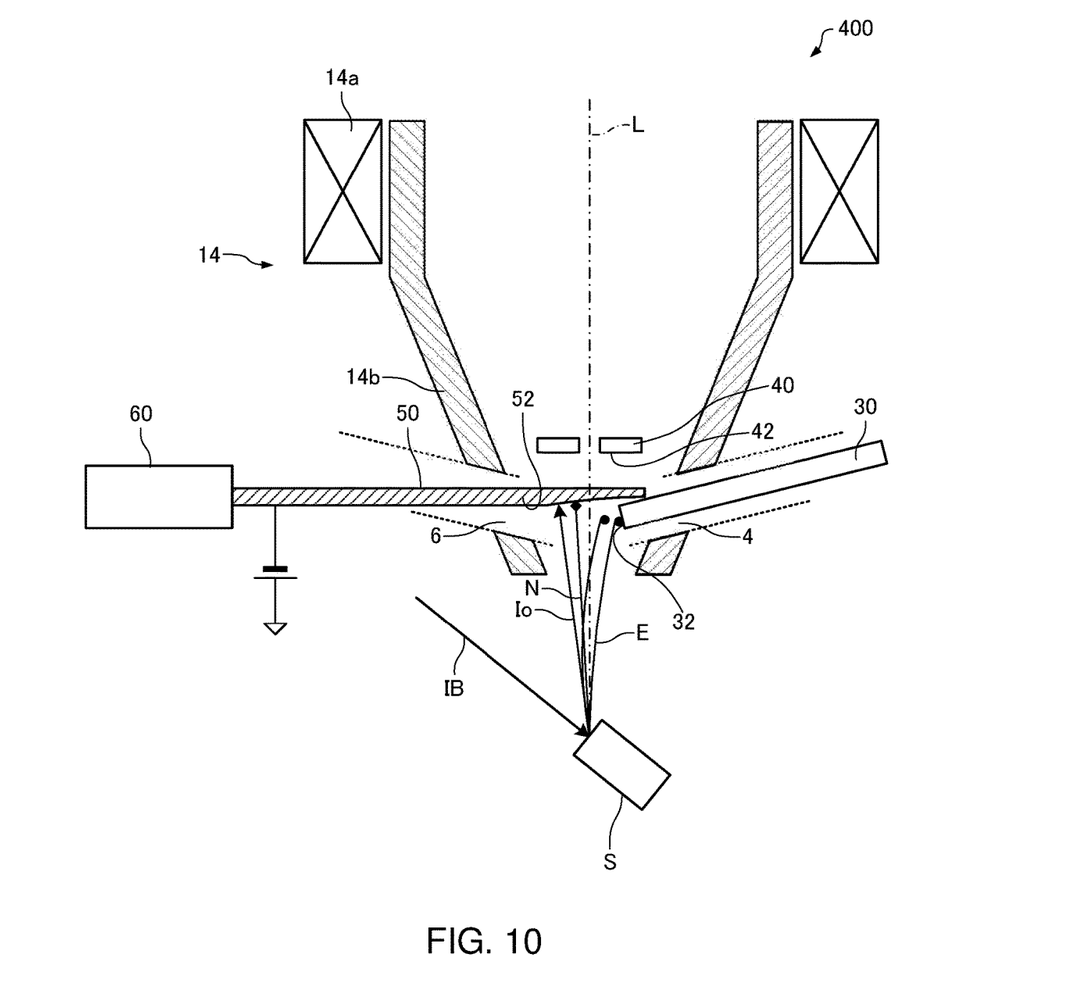
FIG. 10 is a schematic view illustrating a configuration of the vicinity of an objective lens in a scanning electron microscope according to a third modification.

FIG. 10 is a schematic view illustrating a configuration of the vicinity of the objective lens 14 in a scanning electron microscope 400 according to the third modification. Note that FIG. 10 corresponds to FIG. 2.

In the scanning electron microscope 400 according to the third modification, in the same manner as in the scanning electron microscope 300 according to the second modification illustrated in FIG. 8, a predetermined voltage is applied to the shielding plate 50. In addition, in the scanning electron microscope 400, the shielding plate 50 is formed in a shape in which such a force (electrostatic force) as to lead the secondary electrons E to the detection surface 32 of the secondary-electron detector 30 is generated. This allows a larger number of the secondary electrons E to be incident on the detection surface 32 of the secondary-electron detector 30 and can further improve the detection efficiency.

2.4. Fourth Modification

Figure 11:
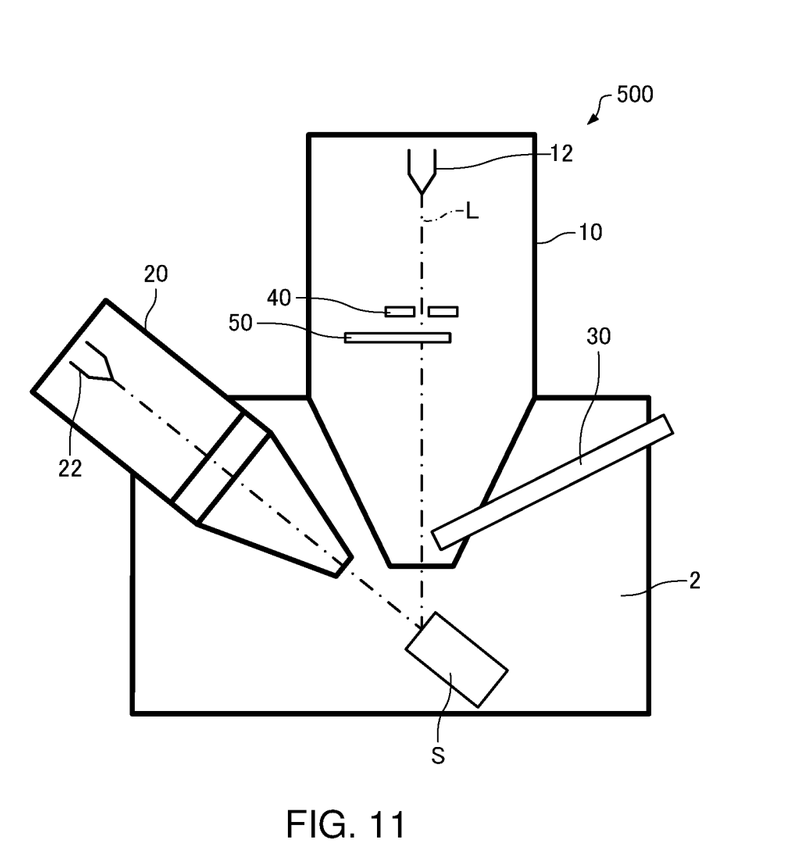
FIG. 11 is a schematic view illustrating a scanning electron microscope according to a fourth modification.
Figure 12:
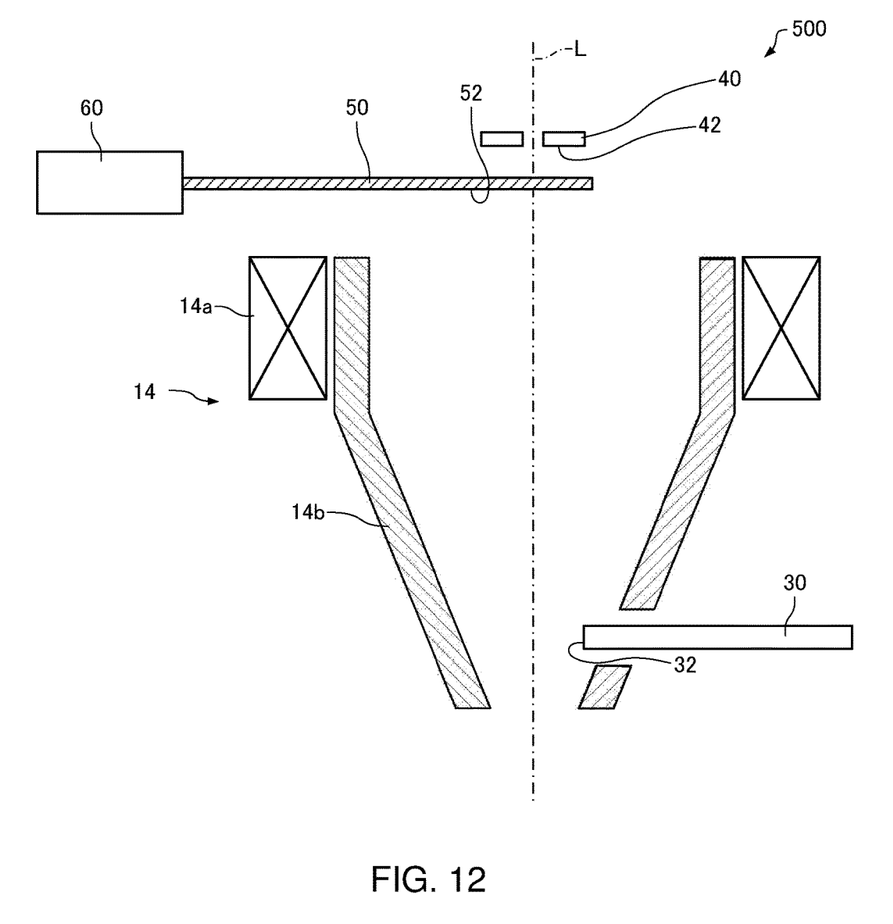
FIG. 12 is a schematic view illustrating the configuration of the vicinity of an objective lens in the scanning electron microscope according to the fourth modification.

FIG. 11 is a schematic view illustrating a scanning electron microscope 500 according to the fourth modification. FIG. 12 is a schematic view illustrating a configuration of the vicinity of the objective lens 14 in the scanning electron microscope 500 according to the fourth modification. Note that FIG. 11 corresponds to FIG. 1, while FIG. 12 corresponds to FIG. 2.

In the scanning electron microscope 100 described above, as illustrated in FIGS. 1 and 2, the backscattered-electron detector 40 is disposed in the objective lens 14. By contrast, in the scanning electron microscope 500, as illustrated in FIGS. 11 and 12, the backscattered-electron detector 40 is disposed outside the objective lens 14.

Specifically, the backscattered-electron detector 40 is disposed above the objective lens 14 (closer to the electron source 12). The backscattered-electron detector 40 is disposed, e.g., between the objective lens 14 and a focusing lens (condenser lens not shown). The focusing lens is disposed between the electron source 12 and the objective lens 14 and used to control the diameter of the electron probe and a probe current (incident beam current).

In the scanning electron microscope 500, the backscattered-electron detector 40 is disposed outside the objective lens 14. Accordingly, the shielding plate 50 is also similarly disposed outside the objective lens 14 (above the objective lens 14).

The scanning electron microscope 500 can achieve the same effects as achieved by the scanning electron microscope 100 described above.

2.5. Fifth Modification

Figure 13:
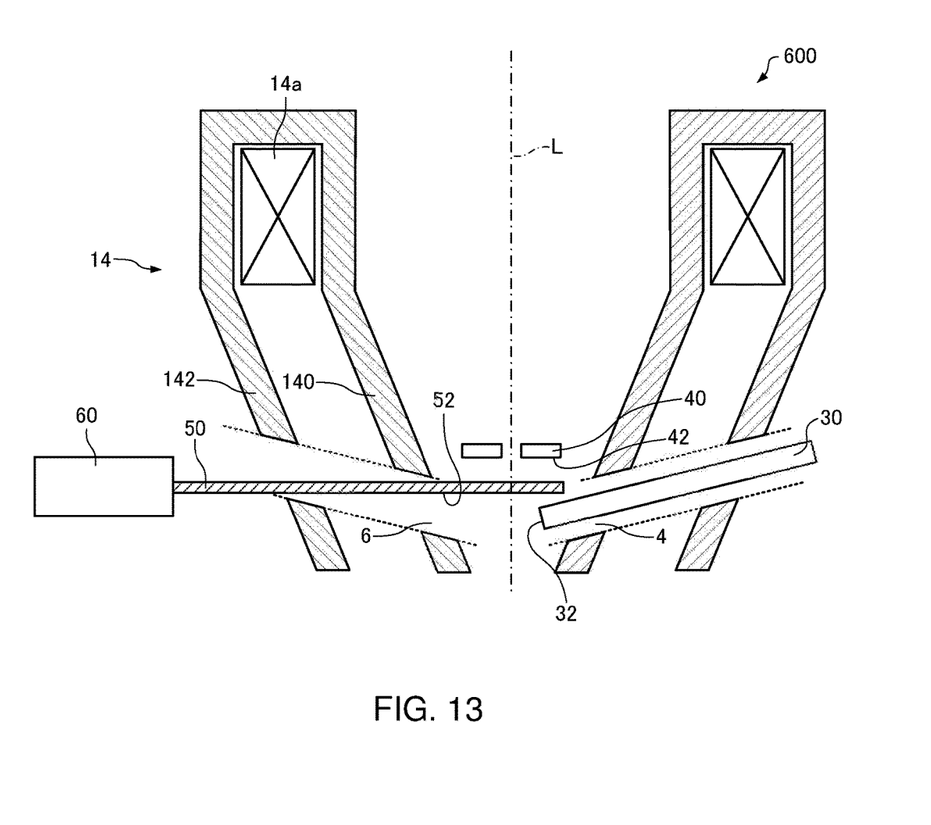
FIG. 13 is a schematic view illustrating a configuration of the vicinity of an objective lens in a scanning electron microscope according to a fifth modification.

FIG. 13 is a schematic view illustrating a configuration of the vicinity of the objective lens 14 in a scanning electron microscope 600 according to a fifth modification. Note that FIG. 13 corresponds to FIG. 2.

In the scanning electron microscope 100 described above, as illustrated in FIG. 2, the objective lens 14 is the single pole peace lens having the one magnetic pole 14b. By contrast, in the scanning electron microscope 600, the objective lens 14 is a semi-in-lens having two magnetic poles (an inner magnetic pole 140 and an outer magnetic pole 142).

In the objective lens 14, a single lens magnetic field is formed below the respective lower end surfaces of the inner magnetic pole 140 and the outer magnetic pole 142. In the lens magnetic field, a specimen (not shown) is placed.

The opening 4 for allowing the secondary-electron detector 30 to pass therethrough is provided so as to extend through the inner magnetic pole 140 and the outer magnetic pole 142. The opening 6 for allowing the shielding plate 50 to pass therethrough is provided so as to extend through the inner magnetic pole 140 and the outer magnetic pole 142.

The scanning electron microscope 600 according to the fifth modification can achieve the same effects as achieved by the scanning electron microscope 100 described above.

2.6. Sixth Modification

As illustrated in FIG. 1, the scanning electron microscope 100 described above includes the FIB device (FIB column 20). Accordingly, in the scanning electron microscope 100, the processing of the specimen S using the FIB and the observation of the specimen S using the SEM can be performed.

By contrast, in the sixth modification, a scanning electron microscope includes a cleaning device which cleans the specimen S using charged particles such as plasmas or ions.

The cleaning device decomposes and removes contamination on the surface of the specimen using charged particles such as plasmas or ions.

In the scanning electron microscope according to the sixth modification also, in the same manner as in the scanning electron microscope 100 illustrated in FIG. 2, the shielding plate 50 is provided. Accordingly, in the scanning electron microscope according to the sixth modification also, it is possible to allow the secondary-electron detector 30 to detect secondary electrons during cleaning (processing) using plasmas or ions, while preventing the contamination of the backscattered-electron detector 40. Consequently, in the scanning electron microscope according to the sixth modification, it is possible to suppress the deterioration of the detection sensitivity of the backscattered-electron detector due to the contamination thereof and also monitor the state of the specimen S during processing.

As illustrated in FIG. 1, the scanning electron microscope 100 described above also includes the FIB column 20, and the processing of the specimen S is performed using the focused ion beam. The scanning electron microscope according to the sixth modification may also include an ion-beam device which processes the specimen S using an ion beam (an unfocused ion beam such as, e.g., an Ar ion beam). In such a case also, the same effects as achieved by the scanning electron microscope 100 described above can be achieved.

Note that the embodiments and the modifications which are described above are only exemplary, and the invention is not limited thereto. For example, the above embodiments and the modifications may be appropriately combined.

The invention includes various other configurations substantially the same as the configuration described in connection with the above embodiments (e.g., a configuration having the same function, method, and results, or a configuration having the same objective and effects) as the configuration described in the embodiment. The invention also includes a configuration in which an unsubstantial section (element) described in connection with the above embodiments is replaced by another section (element). The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

Although some embodiments of the invention has thus been described above in detail, those skilled in the art would readily appreciate that many modifications are possible in the embodiments without materially departing from the new matters and effects of the invention. Accordingly, all such modifications are intended to be included within the scope of the invention.

What is claimed is:

1. A scanning electron microscope having a charged particle device that processes a specimen using a charged particle beam, the scanning electron microscope comprising:

an electron source;

a secondary-electron detector that detects secondary electrons generated from the specimen;

a backscattered-electron detector that is disposed closer to the electron source than a detection surface of the secondary-electron detector to detect backscattered electrons generated from the specimen;

a shielding plate for shielding a detection surface of the backscattered-electron detector; and a moving mechanism that moves the shielding plate, wherein in a state where the shielding plate is moved by the moving mechanism so as to shield the detection surface of the backscattered-electron detector, the shielding plate is located between the detection surface of the backscattered-electron detector and the detection surface of the secondary-electron detector.

2. The scanning electron microscope according to claim 1, further comprising:

an objective lens, wherein the objective lens has a configuration in which the specimen is placed in a lens magnetic field generated by the objective lens.

3. The scanning electron microscope according to claim 2, wherein the objective lens has a first opening provided to extend in a direction orthogonal to an optical axis of the objective lens and allow the secondary-electron detector to pass therethrough and a second opening provided to extend in a direction orthogonal to the optical axis and allow the shielding plate to pass therethrough, and each of the first opening and the second opening has a shape having a longitudinal direction along the optical axis when viewed from the direction orthogonal to the optical axis.

4. The scanning electron microscope according to claim 1, wherein a predetermined voltage is applied to the shielding plate to cause a repulsive force between the shielding plate and the secondary electrons.

5. The scanning electron microscope according to claim 1, wherein the charged particle device is a focused ion-beam device.

6. The scanning electron microscope according to claim 1, wherein the secondary-electron detector detects secondary electrons generated by irradiation of the charged particle beam emitted from the charged particle device to the specimen.

* * * * *